United States Patent [19]

Fickes

[11] 4,069,076

[45] Jan. 17, 1978

[54] LIQUID LAMINATION PROCESS

[75] Inventor: Michael Glenn Fickes, Matawan, N.J.

[73] Assignee: E. I. Du Pont de Nemours and Company, Wilmington, Del.

[21] Appl. No.: 745,680

[22] Filed: Nov. 29, 1976

[51] Int. Cl.² ............................................. B32B 31/02
[52] U.S. Cl. ......................................... 156/83; 96/36; 96/83; 156/236; 156/247; 156/307; 156/659
[58] Field of Search ................... 156/83, 87, 230, 236, 156/241, 247–249, 307, 308, 659–661; 96/35.1, 36, 36.2, 38.3, 38.4, 83; 427/259, 299, 307, 309, 322, 327

[56] References Cited

U.S. PATENT DOCUMENTS

| | | | |
|---|---|---|---|
| 3,402,087 | 9/1968 | Yackel et al. | 156/307 X |
| 3,617,411 | 11/1971 | Couture et al. | 156/307 X |
| 3,629,036 | 12/1971 | Isaacson | 156/241 |
| 3,976,524 | 8/1976 | Feng | 427/259 X |

*Primary Examiner*—William A. Powell

[57] ABSTRACT

The process of this invention applies a photoresist film to a preimaged patterned relief substrate wherein the height of the relief image is at least 0.00004 inch (0.001 mm) and the thickness of the photoresist film is at least one third the thickness of the relief image height. Prior to the application of the photoresist film, the patterned relief substrate is flooded with a swelling agent for the photoresist, the depth of flooding being at least to cover the relief height. The process can occur at room temperature.

9 Claims, No Drawings

LIQUID LAMINATION PROCESS

BACKGROUND OF THE INVENTION

1. Field of the Invention

This invention relates to a process for applying a film to a relief substrate, and, more particularly to a process for applying a photoresist film to a preimaged patterned relief substrate by flooding the substrate to cover the relief prior to application of the photoresist film.

2. Description of the Prior Art

The application of dry film resist materials to substrates, such as printed circuit boards, is known. Typical substrates, e.g., copper clad epoxy or phenolic boards, metal clad ceramic substrates, etc., are substantially flat and smooth prior to processing except for microscopic surface irregularities or scratches resulting from machining or manufacture. Typically, dry film resists are applied to the aforementioned substrates by lamination on a roll-type laminator at elevated temperature to effect heat and pressure bonding and to achieve intimate contact on a microscopic scale between the photoresist and the microscopically irregular substrate surface. The bond obtained is satisfactory and practical for these applications and, in fact, is standard in the printed circuit industry.

U.S. Pat. No. 3,629,036 discloses an alternate method of applying photoresists to substrates which has some advantages over hot laminations. In the described process, a very thin coating of liquid adhering agent 10 to 20 millionths of an inch (0.00025–0.00051 mm) thick, which preferably is a solvent for the resist and contains a small amount of dissolved resist, e.g., 0.5 to 5.0% by weight, is applied to the substantially flat substrate surface, and the dry film resist is then applied whereby the resist surface becomes softened and adhered to the substrate. This method eliminates the use of heat which may damage the dry film resist structure or its support film for certain selected compositions or film structures. The need for substantial pressure during lamination is also reduced. Dissolved resist is stated to be present to provide a fill for the microscopic surface irregularities and to eliminate minute voids of trapped air pockets which may degrade the bonding and permit seepage of etchant. While the described process may be advantageous for those photoresists where heat and pressure bonding does not provide enough plasticity and flow to achieve intimate contact of the relatively thick resists, e.g., 0.0005 to 0.005 inches (0.013 to 0.13 mm) and more over the minute irregularities (resist thickness to irregularity height ratio is 50:1 or greater), most commercial photoresist films and heated roll laminators achieve adequate bonding so that hot roll lamination is the preferred standard practice for applying dry film photoresists.

Often it is desired to laminate dry film resists to substrates that contain relief images on their surfaces as opposed to the substantially flat substrates discussed above. These substrates are of the same or similar materials as described above but contain on their surface patterned relief images in the form of completed or partially completed circuits or circuit elements or other functional or decorative relief. For example, completed printed circuits contain metallic relief image heights of 0.001 to 0.005 inches (0.025 to 0.13 mm) or greater for macroelectronic uses and 0.000045 to 0.0001 inch (0.001 to 0.0025 mm) for microelectronic uses. Often photoresist films of thickness comparable to the relief height or less (resist thickness to relief height ratio of 2:1, 1:1 or less) are laminated to these relief surfaces. In such instances, lamination with standard hot roll laminators often does not allow the resist to conform perfectly around the upraised relief. Instead the resists tend to "tent" over the valleys between the upraised relief trapping large air pockets which subsequently interfere with proper resist exposure and development. The resist tenting over the open spaces is fragile, unsupported resist which is easily broken or damaged, and, more importantly, permits processing solutions, such as etchants or developers, to penetrate far under the resist in large amounts to act on circuit elements that should be protected by the resist from the action of these solutions.

Several methods have been devised to eliminate or reduce this problem by permitting resist to conform more completely to the relief images during lamination. One method, taught in U.S. Pat. No. 3,984,244, achieves improved conformation and substantial elimination of air entrapment by placing grooves in the photoresist just prior to lamination under heat and pressure. The grooves permit air to escape along them thereby substantially eliminating air entrapment. Another method utilizes vacuum lamination in a chamber purged of air to low pressure, followed by heat and pressure lamination, thus greatly reducing trapped air. These two methods are most useful where the resist is thicker than the height of relief.

It has now been found that by the process of the invention, as described below, excellent photoresist conformation to raised relief images ranging from 0.00004 inch (0.001 mm) up to 0.005 inch (0.13 mm) or greater in height is achieved using photoresist films with thicknesses comparable to or less than that of the relief height. The process of invention also prevents the entrapment of air under the laminated resist thereby eliminating the penetration of processing solutions under the exposed and developed images.

SUMMARY OF THE INVENTION

In accordance with this invention there is provided an improved process for applying a photoresist film to a preimaged, patterned relief substrate wherein the height of the relief image is at least 0.00004 inch (0.001 mm) and the thickness of the photoresist film is at least one third the thickness of the relief image height, the improvement comprising flooding with a solvent or nonsolvent swelling agent the patterned relief substrate to a depth of swelling agent at least to cover the relief height prior to the application of the photoresist film.

DETAILED DESCRIPTION OF THE INVENTION

In the process of this invention photoresist films are applied to preimaged, patterned relief substrates by flooding the patterned relief surface with a swelling agent to a depth of such agent to cover at least the relief height, i.e., at least 0.00004 inch (0.001 mm). The term "swelling agent" means a chemical agent which swells the surface of the photoresist so that when swelling agent is absorbed by the photoresist, the photoresist becomes swollen and softened sufficiently to collapse into depressions surrounding the relief areas. In this manner elimination of air entrapment and excellent conformation of the photoresist film to the substrate is achieved. Subsequently, the normal steps of exposure and development are practiced. Etching or plating of metal in the areas where the photoresist was removed as well as other operations can then be practiced as desired.

Practically any known photoresist film can be used in practicing the inventive process. Photoresist films, also known as dry film resists, are exemplified in U.S. Pat. Nos. 3,469,982 and 3,526,504 which are incorporated herein by way of reference. The photoresist may be an initially readily soluble, negative-working photohardenable layer (negative-working photoresist) or an initially poorly soluble photosolubilizable or photodensensitizable layer (positive-working photoresist).

Photohardenable materials are those which become hardened when exposed to actinic radiation and are preferably selected from photopolymerizable, photocrosslinkable and photodimerizable materials. Such materials are usually characterized by having ethylenically unsaturated or benzophenone-type groups and are described in U.S. Pat. Nos. 2,760,863; 3,418,295; 3,649,268; 3,607,264; and 3,622,334, for example.

Photosolubilizable and photodensensitizable materials are those which are solubilized or decomposed, rather than polymerized, in areas exposed to light. When the latter are removed, the unexposed areas remain on the surface as a durable positive resist. Such materials are disclosed in U.S. Pat. Nos. 3,778,270; 3,779,778; 3,782,939; and 3,837,860.

The photoresists, when used in the method of this invention, typically are supplied sandwiched between a layer of polyolefin and a layer of polyester film as a support. The protective, polyolefin layer is peeled off the resist, and the resist is laminated to the substrate. Lamination typically is achieved utilizing either pressure rolls or vacuum lamination techniques at room or elevated temperatures. Care must be taken when heat is used during lamination that the photoresist film or the resist support are not degraded. Room temperature lamination is preferred.

The photoresist is applied to the preimaged patterned relief substrate which can be a liquid covered silicon, aluminum or ceramic wafer or plate (microelectronics) or a liquid covered printed circuit board (macroelectronics). Such boards or wafers are well known items of commerce. In using a wafer the height of the patterned relief on the surface is relatively small, i.e., at least 0.00004 inch (0.001 mm). When a printed circuit board, e.g., an epoxy board, bears the relief, the height thereof can be up to 5.0 mils (0.13 mm) and more. The patterned reliefs are generally raised, metallic, circuit components, such as circuit lines, which are adhered or attached to the wafer or board.

To the preimaged, patterned relief bearing surface is added a swelling agent, i.e., a solvent or non-solvent, preferably the latter, for the particular photoresist composition used in sufficient amount to at least cover the relief height. The relationship between the swelling agent and the photoresist composition is important and is dependent on many factors. A swelling agent that is too active, for example, will leave the photoresist tacky and soupy. Complete resist transfer to a substrate is difficult, since the resist may break cohesively. On the other hand, swelling agents which are too weak do not plasticize the resist rapidly enough to obtain immediate adhesion to the substrate. During removal of the resist support, some of the resist is removed with the support, which is undesirable.

The resist composition, as indicated above, is important with specific swelling agents. For example, if the polymeric binders of the resist composition are nonpolar, it has been found that polar swelling agents leave a thin layer of swelling agent on the surface of the wafer or circuit board. The resist therefore will not adhere in these areas. If the photoresist composition is too highly plasticized or contains too low molecular weight binders, it is difficult to locate a swelling agent which will be absorbed by the resist without leaving the resist too soupy and susceptible to cohesive failure upon delamination of the resist support.

Lamination speed, pressure and roll hardness as well as diameter and temperature all affect the performance of the resist composition. Lamination speed controls the amount of swelling agent in contact with the resist and thus the degree of resist plasticization by the swelling agent. Pressure and roll hardness and roll diameter determine how much excess swelling agent is squeezed off or remains in contact with the resist surface. The temperature controls activity of the swelling agent. Preferred condition ranges are: lamination speed 3 to 10 feet/minute (0.91 to 3.05 meters); nip pressure 3 to 20 pounds/linear inch (53.57 to 357.14 kg/m) and roll diameter 1.0 to 2.5 inches (2.54 to 6.35 cm).

Swelling agents useful in the process include non-solvents and solvents for the specific photoresist composition. The term "non-solvent" means that the agent has no effect on the polymeric binder of the photoresist but may leach out the monomer. The term "solvent" means that the agent will wash out soluble areas of the photoresist. Non-solvent swelling agents include: 1,1,1-trichloroethane, 1-propanol, 2-propanol, n-butanol, isobutanol, perchloroethylene, etc. Solvent swelling agents include: chlorinated hydrocarbons, e.g., methylene chloride, 1,1,1- and 1,1,2-trichloroethane; aromatics, e.g., benzene and toluene; ketones, e.g., acetone and methylethyl ketone; and Cellosolve ®, e.g., ethyl and methyl Cellosolve. Trichloroethane, isopropanol and methylene chloride are particularly preferred swelling agents. It is desirable that the swelling agent also wets the surface of the substrate to insure that any air present is displaced.

After application of the swelling agent to the relief surface, the photoresist film is laminated thereto. Excess swelling agent is squeezed off the substrate surface during lamination. An absorbent carrier is present below the laminate to soak up the swelling agent to prevent excessively long contact of the agent with the photoresist. Absorbent carriers include: paper towel type material, and other permeable material such as non-woven, polyester fiber sheet sold under the Tradename REMAY ® or a non-woven, polyolefin, fiber sheet sold under the Tradename TYVEK ®, both sold by E. I. du Pont de Nemours and Company. In addition, cotton cloth, woolen cloth, linen and similar materials which are absorbent can be used.

The laminate is aged for about 1 to 3 minutes and the cover sheet (or resist support) can either be removed or remain in place if it is transparent to actinic radiation. Removal of the cover sheet (support) permits the swelling agent present to dry at room temperature or in about one minute at about 50° C. The resist-covered substrate is imagewise exposed to actinic radiation by placing a high-contrast transparency image over the transparent support in register with the circuit pattern of the circuit board or wafer and exposing the element conventionally to actinic radiation. In some instances, e.g., when the support is not transparent to actinic radiation or when particularly high resolution is required, the support may first be removed and the image bearing transparency placed directly on the photosensitive layer before exposure to actinic radiation; or the support may be removed and the photosensitive layer then overcoated with or already bearing a thin, non-tacky polymeric layer, e.g., polyvinyl alcohol, etc., and the image-bearing transparency placed in contact with the overcoated element and exposed to actinic radiation.

The polymeric image in the exposed circuit board element can be modified and used in a number of ways. After the support is removed, the more soluble portions of the imaged layer may be washed away with an appropriate solvent to form a polymeric resist image on the surface of the circuit board or wafer. Similarly, in some instances, exposed, or unexposed, portions of the image bearing layer can be removed along with the transparent support as the support is stripped away. In the above instances where the polymeric image bearing layer can be modified by imagewise removal of areas of the layer, the remaining polymeric image may be used as either a solder mask or a gold tab resist, or simply as a decorative or protective encapsulation. The exposed, image bearing layer may also be modified by toning and plating techniques when the surface of the image bearing layer consists of tacky image areas or where image areas can be made tacky as, for instance, by heating. Thus, after removal of the film support from the exposed layer, the tacky image areas can be toned by dusting, or applying with pressure, colorants, pigments, magnetic particles, metallic particles, catalytic particles, etc. When metallic or catalytic particles are used to tone the exposed layer, the image may be further modified by conventional electrolytic or electroless deposition of metal in the toned areas.

Not all thicknesses of photoresist will conform to the patterned reliefs. It has been found that the thickness of the photoresist film must be at least one third the thickness of the relief image height. With appropriate choice of swelling agent, the resist swells and absorbs any trapped swelling agent while collapsing into relief areas giving excellent conformation without trapping any air.

It is possible by utilizing the process of the invention to prepare laminations on both sides of the substrate, simultaneously or one at a time. Preferably the substrate and photoresist are held in the vertical position when simultaneous laminations are performed with appropriate swelling agents.

By the process of the invention, preimaged patterned relief surfaces can be laminated with photoresists in a simple, reliable, low cost manner. Improved conformation has been achieved with elimination of air entrapment. The laminations preferably can be accomplished at room temperature thereby eliminating undesirable fumes that occur at elevated temperatures.

EXAMPLES OF THE INVENTION

The following examples illustrate the invention:

EXAMPLES 1-2

The following examples illustrate the process of this invention as applied to microelectronic, semiconductor wafers.

A coating solution was prepared containing the following ingredients:

| Component | Amount (g) |
| --- | --- |
| Poly(methyl methacrylate/methacrylic acid) (90/10 mole ratio)[1] | 15.2 |
| Pentaerythritol triacrylate containing 0.4% of p-methoxyphenol as thermal inhibitor | 7.05 |
| Tertiary-butylanthraquinone | 0.5 |
| Ethyl Violet (CI Basic Violet 4) dye | 0.025 |
| Methylene chloride | 125.0 |
| Methanol | 25.0 |

[1]Intrinsic viscosity = 0.094 using methyl ethyl ketone as solvent.

This solution was then coated onto polyethylene terephthalate via a "doctor" knife, to yield a thin photopolymerizable resist element, 0.0001 inch-thick (0.0025 mm) when dried. A portion of this element was then laminated to each of two wafers. The lamination was conducted using a Cromalin ® Laminator, Model No. 1301 (product of E. I. du Pont de Nemours & Co., Inc.); this laminator has a hard rubber bottom roll and a medium-hard rubber top roll, each 2.5 inches (6.35 cm) in diameter. The lamination was effected at room temperature (20°-25° C), with a throughput speed of 5 ft. (1.5 meters)/min.

Two wafers, each containing a microrelief surface, were laminated with a portion of the resist element above; the side of the element containing the photopolymerizable layer was placed in contact with the relief surface. One wafer, Example 1, was a silicon wafer covered with an aluminum microrelief, 0.000045 inch (0.001 mm) in depth. This wafer, placed over an absorbent material, was flooded with 1,1,1-trichloroethane, and laminated with the element and the machine described above. Following lamination, the polyethylene terephthalate (coversheet) was removed, after a 2-minute hold time, via a rapid, continuous action, to yield the resist coated wafer.

Similarly, Example 2, to a silicon wafer bearing a silica microrelief, 0.000079 inch (0.002 mm) in depth, was also laminated another portion of the resist using the procedure described in Example 1; in this instance, however, the wafer was flooded with isopropanol prior to lamination.

Both of the above coated wafers were dried at room temperature (20°-25° C) for 30 minutes, then exposed through a resolution test target (1951 U.S. Air Force) to a 200-watt, 4-inch, high pressure mercury arc illuminator (Oriel ® Model No. 8010) at a distance of about 8 inches (20.3 cm) in a vacuum frame. The wafer of Example 1 was exposed for 40 seconds; the wafer of Example 2 was exposed for 60 seconds. The unexposed, non-polymerized portions of each wafer were removed via spray development (under 20 lbs/in$^2$ (1.41 Kg/sq cm) nitrogen pressure) using a mixture (80/20 by volume) of 1,1,1-trichloroethane and isopropanol. Development was complete in 25 seconds with the wafer of Example 1, 35 seconds with the wafer of Example 2. Both wafers were then baked to 150° C for 1 hour.

The resist-protected aluminum-covered wafer of Example 1 was then etched for 5 minutes at 52° C in an etchant of concentrated phosphoric acid/conc. nitric acid/water (in a ratio of 10/1/2.5 volume) containing also a trace of a fluorocarbon surfactant (FC-423, Minnesota Mining and Mfg. Co.). The etched wafer was then rinsed with water and dried. The protective resist was then removed by stripping with methylene chloride, to yield an aluminum pattern on the silicon wafer.

Similarly, the resist-protected silica-coated silicon wafer of Example 2 was etched 22 minutes at room temperature; the etchant consisted of aqueous (210 ml)

ammonium fluoride (40% by weight)/concentrated (30 ml) hydrofluoric acid (49.2% by weight)/aqueous (15 ml) fluorocarbon surfactant (0.02% FC-95, Product of Minn. Mining & Mfg. Co.). The etched wafer was then rinsed with water and dried. The protective resist was then removed (stripped) with methylene chloride to yield a silica pattern on the silicon wafer.

The faithful reproduction of the high resolution test pattern observed on both wafers indicates that excellent conformation of the resist to the microrelief had been achieved, with no air entrapment. When the resist was applied by an ordinary lamination process, however, i.e., without a liquid swelling agent present and with heated laminator rolls (120° C), massive air entrapment in the relief area was evident; under these standard conditions, adhesion was poor, the tented resist was fragile and easily broken, leading to poor target reproduction, unwanted etching, etc., in short, two completely unsatisfactory products.

In these examples, removal of the coversheet prior to exposure permits substantially all the swelling agent, which had displaced air in the relief wells, to permeate through and evaporate from the thin photosensitive layer. Further, it should be noted that the two liquids, 1,1,1-trichloroethane and isopropanol, both swell but do not dissolve the photopolymerizable layer described; the solvents leach out some monomer, but the binder is insoluble.

EXAMPLE 3

A coating solution containing the following ingredients was prepared:

| Component | Amount (g) |
| --- | --- |
| Poly (methyl methacrylate/methacrylic acid) (90/10 mole ratio)[1] | 107.6 |
| Pentaerythritol triacrylate containing 0.4% of p-methoxyphenol as thermal inhibitor | 88.2 |
| Tertiary-butylanthraquinone | 4.0 |
| Ethyl Violet (CI Basic Violet 4) dye | 0.2 |
| Methylene chloride | 400.0 |
| Methanol | 50.0 |

[1]Intrinsic viscosity = 0.094 using methyl ethyl ketone as solvent.

Using conventional methods, the above solution was coated onto polyethylene terephthalate to yield, after drying, a photopolymerizable resist layer approximately 0.0027 inch (0.07 mm) thick. This resist was then laminated to a relief substrate using a roll laminator (1⅛ inch (2.86 cm) diameter hard rubber rolls) at a throughput speed of 3.5 ft. (1.07 meters)/minute at room temperature (20°–25° C). The relief substrate was an epoxy-fiber glass board bearing a copper circuit covered with lead/tin metallization and a relief height ranging from 0.005 to 0.0055 inch (0.127 to 0.139 mm). Before lamination, the substrate was flooded with 1,1,1-trichloroethane. The photopolymerizable layer was then positioned over the relief substrate, and the whole passed through the laminating rolls described above. An absorbent paper towel was positioned under the assembly to absorb the liquid expelled during lamination.

Without removing the coversheet, but after a 10-minute hold period, the photopolymerizable layer was exposed through a photomask delineating the "finger" area of the circuit used to plug the circuit board into external connections. The exposure (for 150 sec.) was made with a mercury arc in a commercial unit (Colight Co., Model DMVL-HP). After exposure, the polyethylene terephthalate cover sheet was removed, and the photopolymer resist image developed in a commercial processor (Riston ® Model "A", product of Du Pont) using a spray developer at 26.7° C. (80° F); the developer contained sodium borate (270 g), 2-butoxy ethanol (2740 g), and a small amount of an antifoaming agent in 7.5 gallons of water (28.4 liters).

The lead/tin metallization was then stripped from the exposed circuit areas by known methods (using Chemelex T Strip ®, a proprietary mixture of fluoboric acid, hydrogen peroxide, and additives). The now-exposed "fingers" were cleaned by immersing the circuit board (30 seconds) in 20% aqueous sulfuric acid followed by a rinse in distilled water. The "finger" area was then electrochemically nickel plated in a nickel sulfamate bath at ~1 amp/sq. inch (0.16 amp/sq. cm) current density for 15 minutes. The nickel bath is sold by Sel-Rex Corporation under the tradename Sulfamex ® nickel sulfamate plating process.

The circuit obtained, as described above, was quite satisfactory; air bubble entrapment around the circuit lines was minimal and inconsequential. In contrast, a control laminated as above, but without using the non-solvent liquid swelling agent, and heated rolls (110° C), exhibited massive air entrapment and tenting over the entire circuit; the control was, in short, quite unsatisfactory and useless.

In this example, since the coversheet was not removed after lamination, it should be pointed out that the relatively thick photopolymerizable layer absorbed the swelling agent present initially in the relief wells without any deleterious effects to the layer.

EXAMPLE 4

A coating composition was prepared containing the following ingredients:

| Component | Amount (g) |
| --- | --- |
| Poly(methyl methacrylate) inherent visocity[1] 0.20 | 75.2 |
| Poly(methyl methacrylte) inherent viscosity[1] 1.20 | 25.0 |
| Pentaerythritol triacrylate | 76.2 |
| Triethylene glycol diacetate | 10.8 |
| 2-tertiary-butylanthraquinone | 10.8 |
| 2,2'-methylene-bis-(4-ethyl-6-tertiary-butyl phenol) | 1.4 |
| Victoria Pure Blue B.O. (C.I.42595) | 0.6 |
| Methylene chloride | 400.0 |

[1]Inherent viscosity of a solution containing 0.25 g polymer in 50 ml chloroform at 25° C.

The solution was coated on polyethylene terephthalate film and dried; the thickness of the dried photopolymerizable layer was 0.0014 inch (0.036 mm). Using the laminating procedure of Example 3, but employing tetrachloroethylene as the (non-solvent) swelling liquid in this example, the layer was then laminated to a copper covered ceramic substrate; the relief ranged from 0.002–0.0025 inch (0.05–0.064 mm). After standing 1.5 hours, the photosensitive layer was exposed (90 sec.), using the device of Example 3, through a high contrast transparency bearing circuit artwork. After removing the polyester coversheet, the photopolymer image was developed at full speed in a commercial machine processor (Riston ® "C" Processor, a product of the Du Pont Co.), with 1,1,1-trichloroethane as the solvent.

The exposed copper circuit was then cleaned by dipping the sample for 10 seconds in 20% sulfuric acid, rinsing with distilled water, immersing for 10 seconds in an ammonium persulfate solution (1.5 lbs/gal. conc. or 0.18 kg/liter), followed by a second distilled water rinse. The cleaned, exposed copper artwork was then electroplated in a bath of copper sulfate at ~2 amp/sq. inch (0.03 amp/sq. cm) current density for 15 minutes. The copper sulfate bath is sold by Sel-Rex Corporation under the tradename Cubath ® No. 1 copper sulfate process. The resist was then stripped off, using methylene chloride.

Satisfactory results were obtained using the liquid laminating process of this invention; air bubble entrapment was minimal. In contrast, a control lamination (at 120° C) with no solvent showed substantial air bubble entrapment. Further, as in Example 3, the coversheet can be left in place following lamination and through exposure. The photopolymerizable layer can absorb the nonsolvent swelling agent with no harmful effects.

EXAMPLE 5

A coating solution containing the following ingredients was prepared:

| Component | Amount (g) |
| --- | --- |
| Terpolymer formed from 56% ethyl acrylate, 37% methyl methacrylate and 7% acrylic acid, Mol. Wt. ca. 260,000, acid number 76–85. | 60.0 |
| 1:1 copolymer of styrene and maleic anhydride, partially esterified with isopropyl alcohol, mol. wt. ca. 1700, acid number ca. 270 | 91.4 |
| Triethylene glycol dimethacrylate | 40.0 |
| Benzophenone | 8.0 |
| Michler's ketone | 0.4 |
| Methylene chloride | 400.0 |
| Methanol | 30.0 |

This composition was coated onto a polyethylene terephthalate film which had a poly (dimethyl siloxane) release coating. The dried coating had a thickness of 0.00165 in. (0.04 mm). Using the substrates, laminator, and processes of Example 4, but using 1,1,1-trichloroethane as the liquid layer, two copper-clad ceramic substrates were laminated. Shortly after lamination (10 sec.), the coversheets were removed with a rapid pulling motion, and the laminate dried (20 minutes at 50° C). Each sample was then exposed as in Example 4 (for 120 seconds), then developed (70 sec.) in 1% aqueous sodium carbonate monohydrate in a commercial processor (Riston ® "A" Processor) at 75° F (23.9° C).

One sample was then electroplated with copper as described in Example 4. The other sample was etched at about 8 feet/minute (2.44 m/min) in a commercial unit Chemcut ® Model 547, using an alkaline etchant made by Southern California Chemical Company, pH of 8.4, of the ammonia/cupric chloride type. After etching, rinsing and drying, the resist was removed in strong alkali, leaving a copper circuit pattern corresponding to the artwork of the process transparency.

With both samples, no air entrapment was observed, and excellent conformation of the resist to the pattern relief was noted. A control lamination, performed in the absence of liquid swelling agent, and with heated rolls (110° C), showed extreme air entrapment and tenting.

EXAMPLE 6

A photopolymerizable formulation suitable for use as a soldermask (Riston ® 740 S, sold by E. I. du Pont de Nemours & Company, Inc.) was coated on polyethylene terephthalate film; the dried thickness was 0.004 inch (0.1mm). This formulation was then laminated to epoxy-fiber glass boards bearing lead/tin circuitry. The relief height ranged from 0.0035–0.0045 inch (0.089–0.11 mm), and areas of the board contained parallel lines 0.015 inch (0.38 mm) wide separated by 0.015 inch (0.38 mm) spaces. The boards were flooded with the solvent methylene chloride, then laminated as in Example 4.

The laminates were then exposed, from 5 minutes to 5 hours after lamination, for 2.5 minutes to the exposure device of Example 3 through a process transparency bearing a circuit target. The coversheet was then removed, and the boards developed for 60 seconds as described in Example 4. The boards were then baked for one hour at 150° C. The developed boards were then fluxed with Alfa ® 809 rosin flux, then processed through a wave solder unit with preheat unit (Hollis, Model 201396) at 3 feet/minute (0.91 m/minute) as known in the art.

Inspecting the resulting boards showed that air entrapment was extremely small and that the coatings withstood the molten solder very well. A few hairline cracks appeared on the surface of the soldermask during the 150° C bake, but they did not affect performance in the wave solder unit.

A control lamination, conducted at 110° C, with no liquid swelling agent, displayed massive air entrapment, which prevents proper resist exposure (due to oxygen inhibition), or blisters badly in the 150° C bake and subsequent wave solder operation.

EXAMPLE 7

A photocrosslinkable formulation, Kodak ® Thin Film Resist KTFR, presumed to be based on cyclized polyisoprene, was coated to a dry thickness of 0.0014 inch (0.036 mm) onto the polyethylene terephthalate film containing the release coating described in Example 5. Using the laminator described in Examples 1–2, and the substrate of Example 4, lamination was effected after flooding the substrate with a solvent for KTFR, 1,1,1-trichloroethane. The coversheet was quickly removed after 0.5 minute, and the resist was dried for 1 hour at room temperature, followed by 7.5 minutes at 100° C. Excellent conformation was observed, with no air entrapment.

Exposure (30 minutes) to the device of Examples 1–2, through a high contrast transparency carrying circuit artwork, followed by development in $C_{10}$ hydrocarbons (Mineral Spirits), then rinsing with water, yielded an image.

I claim:

1. In a process for applying a photoresist film to a preimaged, patterned relief substrate wherein the height of the relied image is at least 0.0004 inch and the thickness of the photoresist film is at least one third the thickness of the relief image height, the improvement comprising flooding with a solvent or non-solvent swelling agent the patterned relief substrate to a depth of swelling agent at least to cover the relief height prior to the application of said photoresist film.

2. A process according to claim 1 wherein said photoresist film is applied at room temperature.

3. A process according to claim 1 wherein the height of the relief image is at least 0.0001 inch.

4. A process according to claim 1 wherein any excess swelling agent is squeezed off the relief substrate at the time the resist film is applied.

5. A process according to claim 4 wherein the excess swelling agent is absorbed by an absorbent carrier.

6. A process according to claim 1 wherein said swelling agent is a non-solvent for the photoresist film.

7. A process according to claim 1 wherein the photoresist film comprises a photohardenable layer.

8. A process according to claim 7 wherein the photohardenable composition is taken from the group consisting of photopolymerizable, photocrosslinkable and photodimerizable compositions.

9. A process according to claim 8 wherein the photohardenable composition is photopolymerizable.

* * * * *

UNITED STATES PATENT OFFICE
CERTIFICATE OF CORRECTION

PATENT NO. : 4,069,076
DATED : January 17, 1978
INVENTOR(S) : Michael Glenn Fickes It is certified that error appears in the above-identified patent and that said Letters Patent are hereby corrected as shown below:

| Patent Column | Line | Corrections |
|---|---|---|
| 8 | 41 | After "methyl", "methacrylte" should be -- methacrylate --. |
| 10 | 53 | After "of the", "relied" should be -- relief --, and "0.0004" should be -- 0.00004 --. |

Signed and Sealed this

Ninth Day of May 1978

[SEAL]

Attest:

RUTH C. MASON
Attesting Officer

LUTRELLE F. PARKER
Acting Commissioner of Patents and Trademarks